April 18, 1967 C. B. DURGIN 3,315,172
HIGH GAIN HYBRID AMPLIFIER
Filed Dec. 31, 1963
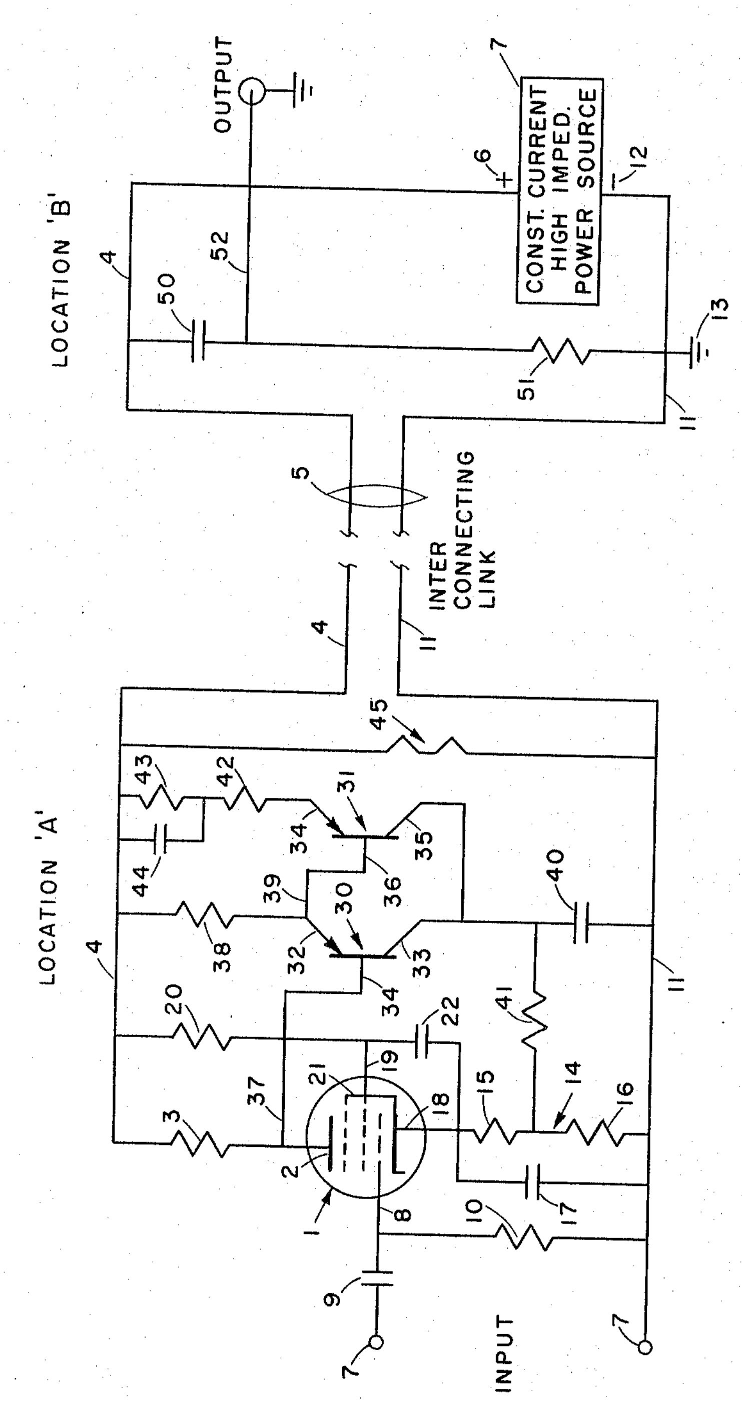
INVENTOR.
Charles B. Durgin
BY
Attorney United States Patent Office 3,315,172
Patented Apr. 18, 1967

3,315,172
HIGH GAIN HYBRID AMPLIFIER

Charles B. Durgin, Pittsburgh, Pa., assignor, by mesne assignments, to the United States of America as represented by the Secretary of the Navy
Filed Dec. 31, 1963, Ser. No. 334,956
7 Claims. (Cl. 330—3)

The present invention relates generally to audio amplifiers and, more particularly, to a high-gain, broad-band audio amplifier of the hybrid type.

In numerous communications systems, such as the remote detection of underwater sound signals, it is necessary to have amplifying equipment at the site of the signal detection apparatus for locally amplifying the informational signals to a level sufficient to permit their transmission over relatively long transmission lines. In the case of a hydrophone amplifier, the detection apparatus and the environment require that it possess certain operational characteristics. For example, besides being capable of amplifying a wide band of audio signal frequencies, the apparatus should be able to operate from a simple low voltage supply with a low current drain therefrom, have a high input impedance and an output impedance low enough to drive a relatively long cable or transmission line.

Because the amplifier is remotely powered, it should also preferably contain a minimum number of stages of amplification. By restricting the number of stages of amplification, power consumption is minimized and the reliability of the apparatus is proportionally enhanced. Moreover, it is good practice to minimize the number and complexity of the interstage coupling networks, for these circuits introduce phase shifts and complicate the stability problem where negative feedback is utilized around amplifying stages. Important also in the case where a network of these amplifiers is required is the minimization of the number of conductors in the transmission cable linking these circuits, the power supply and the output equipment.

An amplifier serving a typical low frequency broadband hydrophone of moderate output capacitance, as mentioned hereinbefore, should possess a high input impedance. When such an amplifier includes a degenerative feedback loop for gain stabilization, it must consist of an even number of stages in order for the feedback signal to have the proper phase. To achieve high input impedance, it is common practice to resort to a first amplifying stage operating at a bias condition resulting in low gain. Thus, for the amplifier to possess a high overall gain and still contain an even number of stages when such a low gain voltage stage is employed, it must be followed by an additional high gain voltage stage or three voltage gain stages. The simplest and most preferable configuration, of course, is to complement the low gain voltage stage with a single high gain voltage amplifying stage, and the present invention is directed to such a circuit.

It is accordingly a primary object of the present invention to provide a high gain amplifier having a wide audio bandwidth and a high input and low output impedance.

Another object of the present invention is to provide a high gain amplifier which includes a minimum number of stages of voltage amplification.

A still further object of the present invention is to provide a hybrid amplifier having a high gain characteristic over a wide band of audio signal frequencies and capable of operating from a common voltage supply with a minimum current drain therefrom.

A yet still further object of the present invention is to provide a high gain hybrid amplifier consisting of a single vacuum tube stage and a complementary pair of transistors which impart to this stage a high input impedance and a low output impedance.

A yet still further object of the present invention is to provide a high gain hybrid amplifier having D.C. stabilization, low power consumption and a common voltage supply and output line.

It is well known that a voltage gain in the order of, for example, forty-six decibels, can be obtained in one stage of amplification by resorting to either a "starved" pentode circuit, a pentode with inductive loading, or to a transistor amplifying stage. Inductance loading in a high-gain, wide-band, audio-frequency preamplifier stage, however, is impractical because of the size of the inductor that is necessary, particularly where space considerations are important. For example, with a pentode having a transconductance of 2,000 micromhos and a plate resistance of 300,000 ohms, a load impedance of about 100,000 ohms is required to achieve a voltage gain of 200 or 46 decibels. To attain such an inductive reactance at twenty cycles, an inductance of 800 henrys is needed. Thus, this solution is unacceptable even without giving consideration to the other problems inherent in inductive loading.

A simple transistor amplifying stage can yield the above voltage gain. However, if such a stage is fed by a preceding low gain amplifying stage, which is the case in the hydrophone application cited above, its very low input impedance excessively loads this preceding stage.

A "starved" pentode operating at a low plate current and transconductance with a very large plate load resistance can give a wide-band, audio-frequency voltage gain of the magnitude mentioned hereinbefore. However, such a pentode stage would have to be followed by circuitry having a very high input impedance, in the order of several megohms. This requirement precludes the utilization of such a pentode stage with a following transmission line link unless additional electron tube circuitry or a very high impedance transistor circuit is incorporated therebetween. Such auxiliary circuitry is undesirable because of complexity and power consumption considerations.

The present invention solves the amplification and impedance problems mentioned above and, moreover, does so in a way compatible with the other requirements set forth. More particularly, the circuit permits a low D.C. resistance to be used in the plate circuit of the pentode, thereby allowing this tube to operate at a high plate current and transconductance. A pair of cascaded emitter-follower transistor stages and a feedback provision from the second of these stages back to the plate circuit give this low D.C. resistance a high A.C. impedance. The system thus achieves a very high, wide-band, audio-frequency voltage gain with only a single voltage amplifying element and at the same time possesses a high input impedance and a low output impedance.

Other objects, advantages and novel features of the invention will become apparent when considered in conjunction with the accompanying drawing, the single figure of which schematically illustrates a preferred embodiment of the invention.

Referring now to this figure, the amplifying circuit which is located at a first site A is seen to contain as its sole voltage amplifying element a pentode 1 connected in a conventional amplifier configuration. More particularly, this pentode has its plate electrode 2 connected through a load resistor 3 of relatively low ohmage to conductor 4, one of the conductors of the two-conductor transmission cable 5 linking location A to location B. Location B, it will be recognized, is the site were the remote power supply 7 is located and where the outut signal is available for further signal processing. At ite B, conductor 4 terminates at point 6, the positive side f power supply 7. This power supply is a conventional onstant current, high impedance type. Consequently, it loes not, as will be seen hereinafter, short circuit the ignal in the system.

The input signal to the amplifier present across terminal ' which is derived from a preceding low gain voltage mplifying stage, not shown, is coupled in a conventional nanner to the control grid 8 of pentode 1 by coupling apacitor 9. It will be appreciated that the input imedance of this pentode when operating at a plate current hat gives a reasonably high gain is an order of magnitude or more below that of a conventional low frequency, road-band hydrophone of moderate output capacitance. Consequently, the input signal for the hybrid amplifier is not taken directly from the hydrophone but from an intervening low gain amplifying stage. Control grid 8 is also coupled through grid leak resistor 10 to the other conductor 11 of the two-conductor transmission cable 5. At site B this line is connected to the negative side 12 of power supply 7. Conductor 11 is also grounded at site B at 13. A network 14, made up of series resistors 15 and 16 paralleled by bypassed capacitor 17, is connected between the cathode 18 and ground. In accordance with conventional practice, screen grid 19 is connected by dropping resistor 20 to the positive voltage line 4 while suppressor grid 21 is directly connected to the cathode. Also, a capacitor 22 is connected between the screen grid and the cathode of pentode 1.

Because plate resistor 3 has a low D.C. value, as mentioned above, pentode 1 normally operates at a high plate current and transconductance. To transform this resistance into an effective, high A.C. impedance and thereby increase the voltage gain of this stage, the present invention connects a pair of transistors 30 and 31 of the same conductivity, namely, the pnp type to the plate circuit of pentode 1. Transistor 30, as is well known, has a semiconductor body, an emitter electrode 32, a collector electrode 33 and a base electrode 34. Likewise, transistor 31 has a semi-conductor body, an emitter electrode 34, a collector electrode 35 and a base electrode 36. Both transistors, it will be seen, are forwardly biased by the operating voltage source 7.

The output of pentode 1, it will be noted, is directly coupled via line 37 to the base of control electrode 34 of transistor 30. The emitter electrode 32 of this transistor is connected by resistor 38 to the positive line 4 and also by conductor 39 directly to the base electrode 36 of transistor 31. The collector electrodes 33 and 35 of both transistors are interconnected and coupled by bypass capacitor 40 to ground and by feedback resistor 41 to the juncture of resistors 15 and 16 in the cathode circuit of pentode 1.

Emitter electrode 34 of transistor 31 is connected by a relatively small gain control resistor 42 and a series resistor 43 to line 4, the positive potential line, and a bypass capacitor 44 is connected from the juncture of these two resistors to this same line. Filaments 45 of pentode 1 are connected across lines 4 and 11.

From the connections above described, it will be seen that transistor 19 is connected in the common collector configuration, so called because the collector electrode is at signal ground potential, and that transistor 31 is also connected in this same configuration. From a study of the over-all circuit, it will be seen that both transistor circuits are connected in cascade in what has come to be called "emitter follower" circuits.

At location B, blocking capacitor 50 in series with A.C. load resistor 51 is connected across lines 4 and 11, and the output is taken at the juncture of these elements through line 52.

Prior to discussing the operation of the above circuit, it would be pointed out that locations A and B are connected by a single pair of conductors, namely, transmission cable 5, whose conductors carry both the D.C. current from power source 7 to the amplifier and the A.C. signal from this amplifier back to location B for further signal processing.

In the operation of the above circuit, the output signal developed in the plate circuit of pentode 1 in response to the appearance of an input signal at terminal 7 is directly connected by line 37 to the base electrode 34 of transistor 30, thereby producing a proportional change in the emitter current flow through resistor 38. The resultant signal generated at emitter 32 is, as is well known, in phase with the signal at base electrode 34. When the output signal from the first transistor stage 30 is next fed to base electrode 36 of transistor 31 by line 39, the signal generated at the latter's emitter electrode 34 likewise possesses a phase corresponding to that of the input signal. Since the cascaded emitter follower stages do not change the phase of the pentode's output signal and since the voltage gain of these stages is very nearly unity, the signal fed back from emitter 34 by capacitor 44 to the supply voltage side of plate resistor 3 is in phase with and slightly less than the signal at the plate side of this resistor. Thus, the A.C. voltage across plate resistor 3 is a very small fraction of the A.C. voltage at the plate of pentode 1 and the A.C. current flow through pentode resistor 3 is very small.

Because of the high input impedance of the cascaded emitter followers, the A.C. current flow into the base of transistor 30 is very small. Hence, most of the A.C. current generated in pentode 1 by the signal voltage on the grid of this tube flows through the internal plate resistance of pentode 1, and the voltage gain of this pentode and of the total circuit approaches the amplification factor $\mu$ or the product of the transconductance and the plate resistance, $g_m r_p$, of the pentode, which is typically very high. Since the emitter follower stage of transistor 31 has a low output impedance, it can directly feed transmission line 5 without impedance mismatching problems.

In connection with the operation of the above circuit, it will be appreciated that capacitor 40 merely is a bypass capacitor whose function is to prevent the signal currents passing through the collectors of the transistors 30 and 31 from developing a signal voltage at the cathode of pentode 1 because of the feedback resistor 41. While the cathode bypass capacitor 17 also serves to avoid this condition, the additional decoupling of capacitor 40 is necessary for very low frequency stability.

The purpose of the feedback from the collector electrodes of transistors 30 and 31 to the cathode of pentode 1 is to stabilize the D.C. biases in the circuit. This feedback tends to minimize variations in the D.C. bias points which may arise from variations in the characteristics of either the electron tube or the transistors.

It would be pointed out that capacitative coupling could be used between the pentode and the transistors. However, such a type of coupling would reduce the gain at low frequencies and increase the number of components in the circuit.

The output signal is taken from line 52 and connected to the juncture of capacitor 50 and resistor 51. As mentioned hereinbefore, since power supply 7 is directly connected across conductors 4 and 11, it must be of the constant current high impedance type in order not to short circuit this isgnal.

Obviously many modifications and variations of the present invention are possible in the light of the above teachings. It is therefore to be understood that within the scope of the appended claims the invention may be practiced otherwise than as specifically described.

What is claimed is:

1. A hybrid amplifier comprising, in combination,
   a pentode tube having a control grid, cathode and plate electrode;
   means for coupling input signals to the control grid of said pentode;

a first resistor, one end thereof being connected to said plate electrode;
a high impedance D.C. power source;
a first conductor connected between the positive terminal of said D.C. power source and the other end of said first resistor;
a second conductor connected between the negative terminal of said high impedance D.C. power source and the cathode of said pentode;
a pair of cascaded emitter follower transistor stages connected between the plate electrode of said pentode and the other end of said resistor whereby the signals developed at the plate of said pentode in response to input signals coupled to the grid thereof are fed back with the same phase and substantially the same amplitude to the other side of said resistor thereby to effectively increase its A.C. impedance;
a blocking capacitor and a second resistor, said blocking capacitor and second resistor being in series across said high impedance D.C. power source;
and means for coupling output signals from the juncture of said blocking capacitor and said second resistor.

2. A hybrid amplifier comprising, in combination,
a pentode tube having at least a control grid cathode and plate electrode;
means for coupling input signals to the control grid of said pentode;
a resistor, one side of said resistor being connected to said plate electrode;
a high impedance D.C. power source;
a first conductor connected between the positive terminal of said D.C. power source and the other side of said resistor;
a second conductor connected between the negative terminal of said high impedance D.C. power source and the cathode of said pentode;
a first transistor stage of the common collector configuration;
a second transistor stage of the common collector configuration cascaded thereto;
means for directly connecting the signal appearing at the plate electrode of said pentode to the input of said first stage and means for connecting the signal in the output of said second stage to the other end of said resistor thereby to increase its effective A.C. impedance;
a second resistor and capacitor in series across said high impedance D.C. power source;
and means for coupling a signal from the junction of said second resistor and said capacitor.

3. A hybrid amplifier comprising, in combination,
a pentode tube having at least a control grid, cathode and plate electrode;
means for coupling input signals to the control grid of said pentode;
a high impedance D.C. power source;
a resistor, one side thereof being connected to said plate electrode;
a two-conductor transmission line, a first conductor of said transmission line being connected between the positive terminal of said D.C. power source and the other side of said plate resistor;
the second conductor of said transmission line being connected between the negative terminal of said D.C. power source and the cathode of said pentode;
first and second transistors of the same conductivity, each transistor having an emitter, collector and base electrode;
means for connecting the base electrode of said first transistor to said plate electrode and the emitter electrode of said first transistor to the base electrode of said second transistor;
means for interconnecting both collector electrodes;

a second resistor connected between the emitter electrode of said first transistor and said first conductor;
a third and fourth resistor in series between the emitter electrode of said second transistor and said first conductor;
a coupling capacitor connected between the junction of said third and fourth resistors and said first conductor thereby to provide an A.C. signal path therebetween;
a blocking capacitor and a fifth resistor in series across said high impedance D.C. power source;
and means for coupling an output signal from the juncture of said blocking capacitor and said fifth resistor.

4. A hybrid amplifier comprising, in combination,
a pentode tube having a control grid, cathode and plate electrode;
means for coupling input signals to the control grids of said pentode;
a first resistor, one end thereof being connected to said plate electrodes;
a high impedance D.C. power source;
a two-conductor transmission line;
a first conductor of said line being connected between the positive terminal of said D.C. power source and the other end of said first resistor;
a second conductor of said line being connected between the negative terminal of said D.C. power source and the cathode of said pentode;
first and second transistors of the pnp configuration, each transistor having a base emitter and collector electrode;
means for directly connecting the plate electrode of said pentode to the base electrode of said first transistor;
means for directly interconnecting the emitter electrode of said first transistor to the base electrode of said second transistor;
means for interconnecting the collector electrodes of said first and second transistors;
a feedback path between the collectors of said first and second transistors and the cathode of said pentode;
a second resistor being connected between the emitter electrode of said first transistor and said first conductor;
third and fourth resistors in series between the emitter electrode and said second transistor and said first conductor;
a coupling capacitor connected between the juncture of said third and fourth resistors and said first conductor;
a blocking capacitor and a fifth resistor in series across said high impedance power source;
and an output conductor connected to the juncture of said blocking capacitor and said fifth resistor for deriving an output signal therefrom.

5. In an arrangement as defined in claim 4 wherein a sixth and seventh resistor are connected in series between the cathode of said pentode and the second conductor of said transmission line and wherein said feedback path is connected to the juncture of said sixth and seventh resistors.

6. In an arrangement as defined in claim 4 wherein said first resistor has an ohmage value of a relatively low magnitude whereby said pentode normally operates at a high plate current and transconductance.

7. In an arrangement as defined in claim 4, a third capacitor connected between the collector electrodes of said first and second transistors and the second conductor of said line, said third capacitor preventing the signal currents passing through the collectors of said transistors from developing a voltage at the cathode of said pentode.

No references cited.

ROY LAKE, *Primary Examiner.*

N. KAUFMAN, *Assistant Examiner.*